United States Patent
Suh et al.

(10) Patent No.: US 9,136,455 B2
(45) Date of Patent: Sep. 15, 2015

(54) SUBSTRATE FOR SEMICONDUCTOR DEVICE, SEMICONDUCTOR DEVICE HAVING THE SUBSTRATE, AND MANUFACTURING METHOD THEREOF

(71) Applicant: Research & Business Foundation Sungkyunkwan University, Suwon-si (KR)

(72) Inventors: Su Jeong Suh, Suwon-si (KR); Hwa Sun Park, Suwon-si (KR); Hyeong Chul Youn, Bucheon-si (KR)

(73) Assignee: Research & Business Foundation Sungkyunkwan University, Suwon-si (KR)

( * ) Notice: Subject to any disclaimer, the term of this patent is extended or adjusted under 35 U.S.C. 154(b) by 0 days.

(21) Appl. No.: 14/638,336

(22) Filed: Mar. 4, 2015

(65) Prior Publication Data
US 2015/0179908 A1    Jun. 25, 2015

Related U.S. Application Data

(62) Division of application No. 13/568,208, filed on Aug. 7, 2012, now Pat. No. 9,000,593.

(30) Foreign Application Priority Data
Aug. 8, 2011  (KR) .......................... 10-2011-0078478

(51) Int. Cl.
*H01L 21/00* (2006.01)
*H01L 33/64* (2010.01)
*H01L 23/14* (2006.01)
*H01L 23/495* (2006.01)

(52) U.S. Cl.
CPC ............ *H01L 33/647* (2013.01); *H01L 23/142* (2013.01); *H01L 23/49562* (2013.01); *H01L 33/64* (2013.01); *H01L 33/641* (2013.01); *H01L 33/642* (2013.01); *H01L 2224/48* (2013.01); *H01L 2224/48091* (2013.01); *H01L 2224/4918* (2013.01); *H01L 2933/0066* (2013.01); *H01L 2933/0075* (2013.01)

(58) Field of Classification Search
CPC ...................................................... H01L 33/64
See application file for complete search history.

(56) References Cited

U.S. PATENT DOCUMENTS

| | | |
|---|---|---|
| 2010/0195308 A1 | 8/2010 | Lin |
| 2010/0240158 A1 | 9/2010 | Ter-Hovhannissian |
| 2011/0031865 A1 | 2/2011 | Hussell et al. |

(Continued)

FOREIGN PATENT DOCUMENTS

| | | |
|---|---|---|
| KR | 10-0593943 B1 | 6/2006 |
| KR | 10-0616692 B1 | 8/2006 |

*Primary Examiner* — Daniel Whalen
(74) *Attorney, Agent, or Firm* — NSIP Law

(57) ABSTRACT

A substrate for a semiconductor device is provided. The substrate includes a first metal line, a second metal line, a metal support part, a first insulating part, and a second insulating part. The first metal line is electrically connected to a first electrode of the semiconductor device. The second metal line is electrically connected to a second electrode of the semiconductor device and spaced apart from the first metal line. The metal support part is disposed between the first metal line and the second metal line. The first insulating part is disposed between the first metal line and the metal support part and configured to electrically insulate the first metal line from the metal support part. The second insulating part is disposed between the second metal line and the metal support part and configured to electrically insulate the second metal line from the metal support part.

5 Claims, 3 Drawing Sheets

(56) References Cited

U.S. PATENT DOCUMENTS

2012/0153317 A1* 6/2012 Emerson et al. ............... 257/89
2013/0214295 A1* 8/2013 Guevara ........................ 257/88
2013/0215121 A1* 8/2013 Guevara et al. ............... 345/501

* cited by examiner

SUBSTRATE FOR SEMICONDUCTOR DEVICE, SEMICONDUCTOR DEVICE HAVING THE SUBSTRATE, AND MANUFACTURING METHOD THEREOF

CROSS-REFERENCE TO RELATED APPLICATION

This present application is a Divisional of U.S. patent application Ser. No. 13/568,208 filed Aug. 7, 2012, which claims the benefit under 35 U.S.C. §119(a) of Korean Patent Application No. 10-2011-0078478, filed on Aug. 8, 2011, in the Korean Intellectual Property Office, the entire disclosures of which are incorporated herein by reference for all purposes.

BACKGROUND

1. Field of the Invention

The present invention relates to a substrate for a semiconductor device, a semiconductor device having the substrate, and a manufacturing method thereof, and more particularly, to a substrate for a semiconductor device having improved heat dissipation characteristics, a semiconductor device having the substrate, and a method of manufacturing the semiconductor device.

2. Discussion of Related Art

In general, a semiconductor device is mounted on a substrate and receives power through the substrate. Recently, among such semiconductor devices, interest in a Light Emitting Diode (LED) that generates light is increasing. The LED is a semiconductor device for converting electrical energy into optical energy. The LED is recently attracting attention as a light source since it has low power consumption, is environmental-friendly, and lasts a long time. The LED has been mainly used in general lights, mobile phones, liquid crystal displays (LCDs), vehicle lights, etc., and its use is expanding to more various industrial fields.

A semiconductor device that receives power emits heat. The heat may deteriorate the characteristics of the semiconductor device if the heat is not dissipated to the outside. Particularly, when it receives power, the LED emits heat while creating light, and the heat emitted from the LED deteriorates the optical efficiency and lifespan of the LED. Accordingly, a considerable amount of research into heat dissipation of a semiconductor device such as a LED device is being conducted. Specifically, research into technology for dissipating heat generated by a semiconductor device through a substrate whose lower surface the semiconductor device is mounted on is being actively conducted. And, considerable effort is aimed at manufacturing a semiconductor package including a semiconductor device at a low cost.

SUMMARY OF THE INVENTION

The present invention is directed to a substrate for a semiconductor device that has excellent heat dissipation characteristics and can be manufactured at a low cost.

The present invention is also directed to a Light Emitting Diode (LED) device including a substrate for a semiconductor device.

The present invention is also directed to a method of manufacturing a semiconductor device capable of achieving process simplification and reducing manufacturing cost.

According to an aspect of the present invention, there is provided a substrate for a semiconductor device including a first metal line, a second metal line, a metal support part, a first insulating part, and a second insulating part. The first metal line is electrically connected to a first electrode of the semiconductor device. The second metal line is electrically connected to a second electrode of the semiconductor device and spaced apart from the first metal line. The metal support part is disposed between the first metal line and the second metal line. The first insulating part is disposed between the first metal line and the metal support part and configured to electrically insulate the first metal line from the metal support part. The second insulating part is disposed between the second metal line and the metal support part and configured to electrically insulate the second metal line from the metal support part.

The metal support part is formed of aluminum, and the first and second insulating parts are formed of aluminum oxide. The first and second metal lines are formed of aluminum or copper.

According to another aspect of the present invention, there is provided a semiconductor device including a substrate and at least one semiconductor element. The substrate includes a metal support part having first and second surfaces opposite to each other and lateral surfaces connecting the first surface to the second surface, a first metal line formed on the first surface, a second metal line formed on the second surface, a first insulating part formed between the first surface and the first metal line, and a second insulating part formed between the second surface and the second metal line. The semiconductor element includes a first electrode electrically connected to the first metal line, and a second electrode electrically connected to the second metal line.

The semiconductor element is disposed on one lateral surface of the metal support part. The metal support part is formed of aluminum, and the first and second insulating parts are formed of aluminum oxide. The first and second metal lines are formed of aluminum or copper According to another aspect of the present invention, there is provided a method of manufacturing a semiconductor device. First, a first insulating layer is formed on a first surface of a support plate, and a second insulating layer is formed on a second surface of the support plate, the second surface being opposite to the first surface. Then, a first metal layer is formed on the first insulating layer, and a second metal layer is formed on the second insulating layer. Next, the first metal layer, the first insulating layer, the support plate, the second insulating layer, and the second metal layer are cut in a direction perpendicular to the first surface of the support plate. Then, a semiconductor element is fixed on the cut section of the support plate. Next, first and second electrodes of the semiconductor element are electrically connected to the first and second metal layers, respectively.

The forming of the first and second insulating layers includes anodizing the support plate formed of a metal material to form metal oxide layers on the first and second surfaces of the support plate, respectively. For example, the support plate is an aluminum plate, and the metal oxide layers are aluminum oxide layers.

The forming of the first metal layer includes attaching a first aluminum thin film or a first copper thin film to the first insulating layer, and the forming of the second metal layer includes attaching a second aluminum thin film or a first copper thin film to the second insulating layer.

The forming of the first metal layer includes depositing or plating aluminum or copper on the first insulating layer, and the forming of the second metal layer includes depositing or plating aluminum or copper on the second insulating layer.

According to the examples described above, by forming a substrate with a metal or metal oxide having excellent thermal conductivity to thus transfer heat generated by a semiconductor device to the lower surface of the substrate, it is possible to improve the lifespan and characteristics of the semiconductor device.

Furthermore, by forming an insulating layer with a constant thickness through anodization, it is possible to improve the electrical characteristics of a semiconductor device.

In addition, it is possible to achieve process simplification and reduce the manufacturing cost of a semiconductor device.

BRIEF DESCRIPTION OF THE DRAWINGS

The above and other objects, features and advantages of the present invention will become more apparent to those of ordinary skill in the art by describing in detail exemplary embodiments thereof with reference to the accompanying drawings, in which.

DETAILED DESCRIPTION OF EXEMPLARY EMBODIMENTS

Figure 1A:
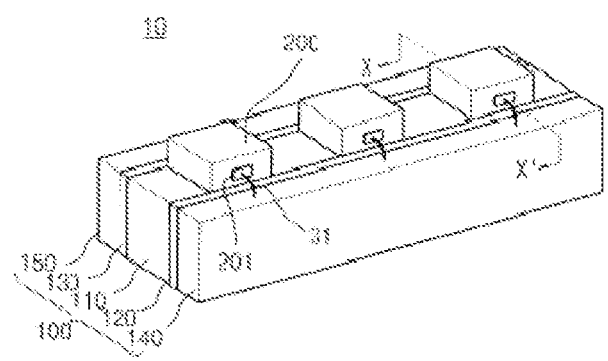
FIG. 1A is a perspective view showing an example of a semiconductor device.

Exemplary embodiments of the present invention will be described in detail below with reference to the accompanying drawings. While the present invention is shown and described in connection with exemplary embodiments thereof, it will be apparent to those skilled in the art that various modifications can be made without departing from the spirit and scope of the invention.

In case it is mentioned that a certain component is "disposed" or "connected" on or to another component or layer, it may be understood that the certain component is directly disposed on or connected to the another component or that a component is interposed between the components. However, in case it is mentioned that a certain component is "directly" disposed or "connected" on or to another component, it should be understood that no component is interposed between the components. Though terms including ordinal numbers such as a "first", a "second", a "third", etc. may be used to explain various components, such as elements, composites, regions, layers and/or parts, the components are not limited to the terms.

Terms used in the present invention are to merely explain specific embodiments, thus it is not meant to be limiting. Except that they are not differently defined, all terms used in the present invention including technical or scientific terms have the same meanings with terms that are generally understood by those skilled in the art related to the field of the present invention. The terms same as those of which are defined in a general dictionary should be understood that the terms have meanings same as contextual meanings of the related art. And, as long as the terms are not definitely defined in the present invention, the terms are not interpreted as ideal or excessively formal meanings.

Examples of the present invention will be described with reference to cross-section drawings that are schematic drawings of ideal embodiments. Accordingly, the drawings allow changes in shape, for example, changes in manufacturing method and/or permissible error. In other words, the examples of the present invention are not limited to the specific shapes illustrated in the drawings but include some deviations in shape. Also, the regions shown in the drawings are merely schematic, and the shapes of the regions are intended neither to show the exact shapes of the regions nor to limit the scope of the invention.

Semiconductor Device

Figure 1B:
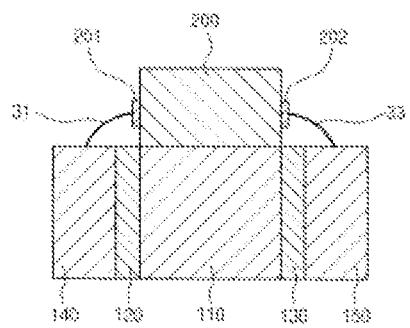
FIG. 1B is a cross-sectional view of the semiconductor device shown in FIG. 1A cut along a line X-X'.

FIG. 1A is a perspective view showing an example of a semiconductor device 10, and FIG. 1B is a cross-sectional view of the semiconductor device 10 shown in FIG. 1A cut along a line X-X'.

Referring to FIGS. 1A and 1B, the semiconductor device 10 includes at least one semiconductor element 200 and a substrate 100.

The semiconductor element 200 may include first and second electrodes 201 and 202 for receiving power from the outside. For example, the semiconductor element 200 may be a Light Emitting Diode (LED) chip. The LED chip 200 is a semiconductor device for converting electrical energy into optical energy. That is, the LED chip 200 may include the first and second electrodes 201 and 202 for receiving power from the outside to generate light. For example, the LED chip 200 may be a red LED chip for generating red light, a green LED chip for generating green light, a blue LED chip for generating blue light, or a white LED chip for generating white light. In the current example, the LED chip 200 may have an arbitrary shape or structure. For example, the LED chip 200 may be a well-known LED chip. Accordingly, details about the LED chip 200 will be omitted.

The substrate 100 may include a metal support part 110, a first insulating part 120, a second insulating part 130, a first metal line 140, and a second metal line 150.

The metal support part 110 may include a first surface, a second surface opposite to the first surface, and connecting surfaces that connect the first surface to the second surface. For example, the metal support part 110 may be in a rectangular shape. The semiconductor element 200 may be disposed on one of the connecting surfaces of the metal support part 110. According to an example, the metal support part 110 may be formed of a metal whose surface can be oxidized by anodization. For example, the metal support part 110 may be formed of aluminum, titanium, tantalum, magnesium, hafnium, or an alloy thereof.

The first insulating part 120 may be formed on the first surface of the metal support part 110. The first insulating part 120 may cover the entire area of the first surface of the metal support part 110. The first insulating part 120 may electrically insulate the metal support part 110 from the first metal line 140. The first insulating part 120 may be formed of an organic or inorganic insulating material. According to an example, the first insulating part 120 may be an anodized layer formed by anodizing the metal support part 110. For example, if the metal support part 110 is formed of aluminum, the first insulating part 120 may be an aluminum oxide layer formed by anodizing the metal support part 110.

The second insulating part 130 may be formed on the second surface of the metal support part 110, the second surface being opposite to the first surface. The second insulating part 130 may cover the entire area of the second surface of the metal support part 110. The second insulating part 130 electrically insulates the metal support part 110 from the second metal line 150. The second insulating part 130 may be formed of an organic or inorganic insulating material. According to an example, the second insulating part 130 may be an anodized oxide layer formed by anodizing the metal support part 110. For example, if the metal support part 110 is formed of aluminum, the second insulating part 130 may be an aluminum oxide layer formed by anodizing the metal support part 110.

The first metal line 140 may be formed on the first insulating part 120. The first metal line 140 may be a metal thin film having substantially the same area as the first surface of the metal support part 110. The first metal line 140 may be formed of a conductive material. For example, the first metal line 140 may be formed of aluminum or copper. According to an example, the first metal line 140 may be a metal thin film attached to the first insulating part 120 through adhesive, etc. According to another example, the first metal line 140 may be a metal thin film formed on the first insulating part 120 through deposition. According to still another example, the first metal line 140 may be a metal thin film formed on the first insulating part 120 through plating such as electroless plating. The first metal line 140 may be electrically connected to the first electrode 201 of the semiconductor element 200. For example, as shown in FIGS. 1A and 1B, the first metal line 140 may be electrically connected to the first electrode 201 of the semiconductor element 200 through a first wire 31. Alternatively, the first metal line 140 may be directly electrically connected to the first electrode 201 of the semiconductor element 200 using solder, an anisotropic conductive film, etc.

The second metal line 150 may be formed on the second insulating part 130. The second metal line 150 may be a metal thin film having substantially the same area as the second surface of the metal support part 110. The second metal line 150 may be formed of a conductive material. For example, the second metal line 150 may be formed of aluminum or copper. According to an example, the second metal line 150 may be a metal thin film attached to the second insulating part 130 through adhesive, etc. According to another example, the second metal line 150 may be a metal thin film formed on the second insulating part 130 through deposition. According to still another example, the second metal line 150 may be a metal thin film formed on the second insulating part 130 through plating such as electroless plating. The second metal line 150 may be electrically connected to the second electrode 202 of the semiconductor element 200. For example, as shown in FIGS. 1A and 1B, the second metal line 150 may be electrically connected to the second electrode 202 of the semiconductor element 200 through a second wire 33. Alternatively, the second metal line 150 may be directly electrically connected to the second electrode 202 of the semiconductor element 200 using solder, an anisotropic conductive film, etc.

In the semiconductor device 10 according to the current example, by fixing the semiconductor element 200 on one of the connecting surfaces of the metal support part 110, it is possible to quickly dissipate heat generated from the semiconductor element 200 through the lower surface of the substrate 100.

Method of Manufacturing a Semiconductor Device

FIGS. 2A through 2D are perspective views for explaining an example of a method of manufacturing a semiconductor device.

Figure 2A:
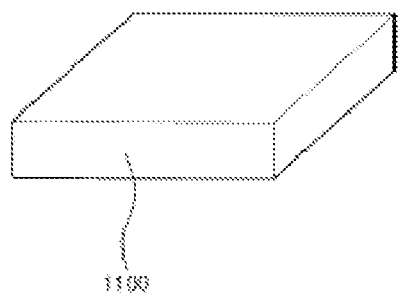
FIGS. 2A through 2D are perspective views for explaining an example of a method of manufacturing a semiconductor device.

Referring to FIG. 2A, a support plate 1100 is prepared. The support plate 1100 may be formed of a metal or alloy whose surface can be oxidized by anodization. For example, the support plate 1100 may be formed of aluminum, titanium, tantalum, magnesium, hafnium, or an alloy thereof.

Figure 2B:
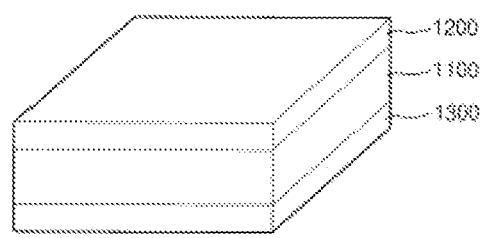

Next, referring to FIG. 2B, a first insulating layer 1200 is formed on the upper surface of the support plate 1100, and a second insulating layer 1300 is formed on the lower surface of the support plate 1100. The first and second insulating layers 1200 and 1300 may be formed of an organic or inorganic insulating material. According to an example, the first and second insulating layers 1200 and 1300 may be formed by anodizing the support plate 1100 so that an anodized oxide film is formed on the entire surface of the support plate 1100. For example, if the support plate 1100 is an aluminum plate, an aluminum oxide film may be formed on the entire surface of the aluminum plate 1100 by anodizing the aluminum plate 1100. In this case, the aluminum oxide film formed on the upper surface of the aluminum plate 1100 may act as the first insulating layer 1200, and the aluminum oxide film formed on the lower surface of the aluminum plate 1100 may act as the second insulating layer 1300.

Figure 2C:
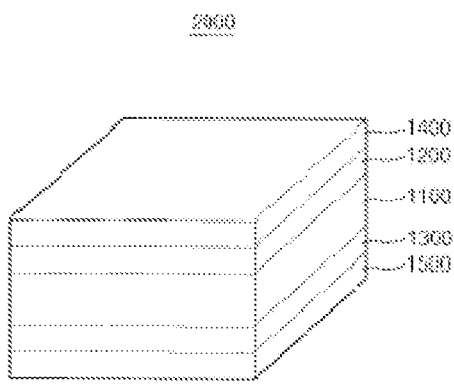

Then, referring to FIG. 2C, a first metal layer 1400 is formed on the first insulating layer 1200, and a second metal layer 1500 is formed on the second insulating layer 1300. The first metal layer 1400 may be formed to cover the entire area of the upper surface of the support plate 1100, and the second metal layer 1500 may be formed to cover the entire area of the lower surface of the support plate 1100. The first and second metal layers 1400 and 1500 may be formed of a conductive material. For example, the first and second metal layers 1400 and 1500 may be formed of aluminum or copper. According to an example, first and second metal thin films are attached to the first and second insulating layer 1200 and 1300, respectively, using adhesive, etc., to thereby form the first and second metal layers 1400 and 1500, respectively. According to another example, the first and second metal layers 1400 and 1500 may be formed on the first and second insulating layer 1200 and 1300, respectively, through deposition. According to still another example, the first and second metal layers 1400 and 1500 may be formed on the first and second insulating layer 1200 and 1300, respectively, through plating such as electroless plating.

For convenience of description, a substrate manufactured through the process described above is referred to as a "mother substrate" 2000. That is, the mother substrate 2000 includes the support plate 1100, the first insulating layer 1200, the second metal layer 1400, the second insulating layer 1300, and the second metal layer 1500, wherein the first insulating layer 1200 and the first metal layer 1400 are sequentially formed on the upper surface of the support plate 1100, and the second insulating layer 1300 and the second metal layer 1500 are sequentially formed on the lower surface of the support plate 1100.

Figure 2D:
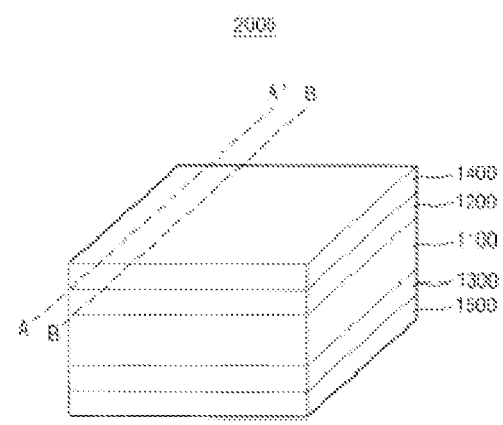

Next, referring to FIG. 2D, the mother substrate 2000 is cut in a direction perpendicular to the upper or lower surface of the support plate 1100, thereby manufacturing a substrate that will be used for the semiconductor device according to the present invention. The mother substrate 2000 may be cut by a mechanical method or using a laser. For example, a laser cutter is used to cut the mother substrate 2000 in a direction perpendicular to the upper or lower surface of the support plate 1100. In detail, the mother substrate 2000 may be cut along a first section that is spaced apart by a predetermined distance from one (referred to as a first lateral surface) of the lateral surfaces of the mother substrate 2000 and that is parallel to the first lateral surface, and the cut-off portion may be used as a substrate for the semiconductor device according to the present invention. If the first lateral surface of the mother substrate 2000 is not flat or has a defect, the mother substrate 200 is primarily cut along a first section that is substantially parallel to the first lateral surface of the mother substrate 2000 in order to remove the defective portion, and then the mother substrate 2000 is secondarily cut along a second section that is spaced apart by a predetermined from the first section and parallel to the first section, so that the cut-off portion between the first and second sections is used as a substrate for the semiconductor device according to the present invention.

Then, referring again to FIGS. 1A and 1B, the semiconductor element 200 is fixed on one cut section of the substrate 100. The semiconductor element 200 may be an LED chip. The cut section of the substrate 100 includes the cut sections of the first and second metal layers 1400 and 1500 (the first and second metal lines 140 and 150 in FIGS. 1A and 1B) formed in parallel at both lateral sides of the substrate 100, the cut section of the support plate 1100 (the support part 110 in FIGS. 1A and 1B) formed in the center portion of the substrate 100 and coplanar with the cut sections of the first and second metal layers 1400 and 1500, the cut section of the first insulating layer 1200 (the first insulating part 120 in FIGS. 1A and 1B) formed between the cut section of the first metal layer 1400 and the cut section of the support plate 1100, and the cut section of the second insulating layer 1300 (the second insulating part 130 in FIGS. 1A and 1B) formed between the cut section of the second metal layer 1500 and the cut section of the support plate 1100. The semiconductor element 200 may be fixed on the cut section of the support plate 1100.

Thereafter, the first electrode 201 of the semiconductor element 200 is electrically connected to the first metal layer 1400. Next, the second electrode 202 of the semiconductor element 200 is electrically connected to the second metal layer 1500. For example, the first and second electrodes 201 and 202 of the semiconductor element 200 may be electrically connected to the first and second metal layers 1400 and 1500 through the first and second wires 31 and 33, respectively. Alternatively, the first electrode 201 of the semiconductor element 200 is formed to extend onto the cut section of the first metal layer 1400, the second electrode 202 of the semiconductor element 200 is formed to extend onto the cut section of the second metal layer 1500, and then the first and second electrodes 201 and 202 are connected directly to the first and second metal layers 1400 and 1500, respectively, using solder, an anisotropic conductive film, etc.

According to the semiconductor device manufacturing method described above, since insulating layers can be formed with constant thicknesses, it is possible to improve the electrical characteristics of a semiconductor device and manufacture the semiconductor device at low cost through a simple process. Also, the thickness of a substrate on which semiconductor device is mounted can be easily adjusted as necessary.

It will be apparent to those skilled in the art that various modifications can be made to the above-described exemplary embodiments of the present invention without departing from the spirit or scope of the invention. Thus, it is intended that the present invention covers all such modifications provided they come within the scope of the appended claims and their equivalents.

What is claimed is:

1. A method of manufacturing a semiconductor device, comprising:
    forming a first insulating layer on a first surface of a support plate, and forming a second insulating layer on a second surface of the support plate, the second surface being opposite to the first surface;
    forming a first metal layer on the first insulating layer;
    forming a second metal layer on the second insulating layer;
    cutting the first metal layer, the first insulating layer, the support plate, the second insulating layer, and the second metal layer, in a direction perpendicular to the first surface of the support plate;
    fixing a semiconductor element on the cut section of the support plate; and
    electrically connecting first and second electrodes of the semiconductor element to the first and second metal layers, respectively.

2. The method of claim 1, wherein the forming of the first and second insulating layers comprises anodizing the support plate formed of a metal material to form metal oxide layers on the first and second surfaces of the support plate, respectively.

3. The method of claim 1, wherein the support plate is an aluminum plate, and the metal oxide layers are aluminum oxide layers.

4. The method of claim 1, wherein the forming of the first metal layer comprises attaching a first aluminum thin film or a first copper thin film to the first insulating layer, and
    the forming of the second metal layer comprises attaching a second aluminum thin film or a first copper thin film to the second insulating layer.

5. The method of claim 1, wherein the forming of the first metal layer comprises depositing or plating aluminum or copper on the first insulating layer, and
    the forming of the second metal layer comprises depositing or plating aluminum or copper on the second insulating layer.

* * * * *